United States Patent [19]

Ito et al.

[11] Patent Number: 5,428,389
[45] Date of Patent: Jun. 27, 1995

[54] IMAGE DATA STORAGE/PROCESSING APPARATUS

[75] Inventors: Kenji Ito; Kaoru Adachi; Osamu Saito, all of Tokyo, Japan

[73] Assignee: Fuji Photo Film Co., Ltd., Kanagawa, Japan

[21] Appl. No.: 104,928

[22] Filed: Aug. 12, 1993

Related U.S. Application Data

[63] Continuation of Ser. No. 711,100, Jun. 6, 1991, abandoned.

[30] Foreign Application Priority Data

Jun. 14, 1990 [JP] Japan .................. 2-153902
Sep. 7, 1990 [JP] Japan .................. 2-235555

[51] Int. Cl.⁶ .......................... H04N 5/76; H04N 9/64
[52] U.S. Cl. .................................. 348/231; 348/718; 348/403; 358/909.1; 358/335
[58] Field of Search ............... 358/41, 44, 11, 12, 358/140, 141, 133, 160, 14, 15, 22, 909, 906, 135, 310, 335, 213.26, 313, 325; 360/32, 33.1, 137; 348/230, 231, 232, 233, 234, 235, 236, 386; H04N 5/76

[56] References Cited

U.S. PATENT DOCUMENTS

| | | | |
|---|---|---|---|
| 4,521,802 | 6/1985 | Ikeda | 358/11 |
| 4,774,564 | 9/1988 | Konishi | 358/41 |
| 4,858,025 | 8/1989 | Tabei | 358/310 |
| 4,894,715 | 1/1990 | Uchikubo et al. | 358/160 |
| 5,010,413 | 4/1991 | Bahr | 358/160 |
| 5,032,927 | 7/1991 | Watanabe et al. | 358/909 |
| 5,057,932 | 10/1991 | Lang | 358/133 |
| 5,153,730 | 10/1992 | Nagasaki et al. | 348/231 |

FOREIGN PATENT DOCUMENTS

| | | | |
|---|---|---|---|
| 0230288 | 10/1987 | Japan | H04N 9/80 |
| 0230289 | 10/1987 | Japan | H04N 9/80 |
| 2143695 | 6/1990 | Japan | H04N 9/80 |

*Primary Examiner*—James J. Groody
*Assistant Examiner*—Michael H. Lee

[57] ABSTRACT

An image data storage/processing apparatus is provided, which is particularly applicable to an electronic still camera, for example. The image data storage apparatus uses a dynamic RAM as a frame memory for temporarily storing image data representative of a field of an image to be recorded. The frame memory includes at least first and second memories. In the apparatus, there is provided a control so that the image data corresponding to the adjacent two pixel lines on the field are continuously read out in such a manner that they are simultaneously read out from the first and second memories, and the image data corresponding to one of the two pixel lines are read out with delay by the time required for reading out of the image data corresponding to the other pixel line. The image signal processing apparatus is capable of performing processing for writing in and reading out of various types of image data with a single memory.

11 Claims, 11 Drawing Sheets

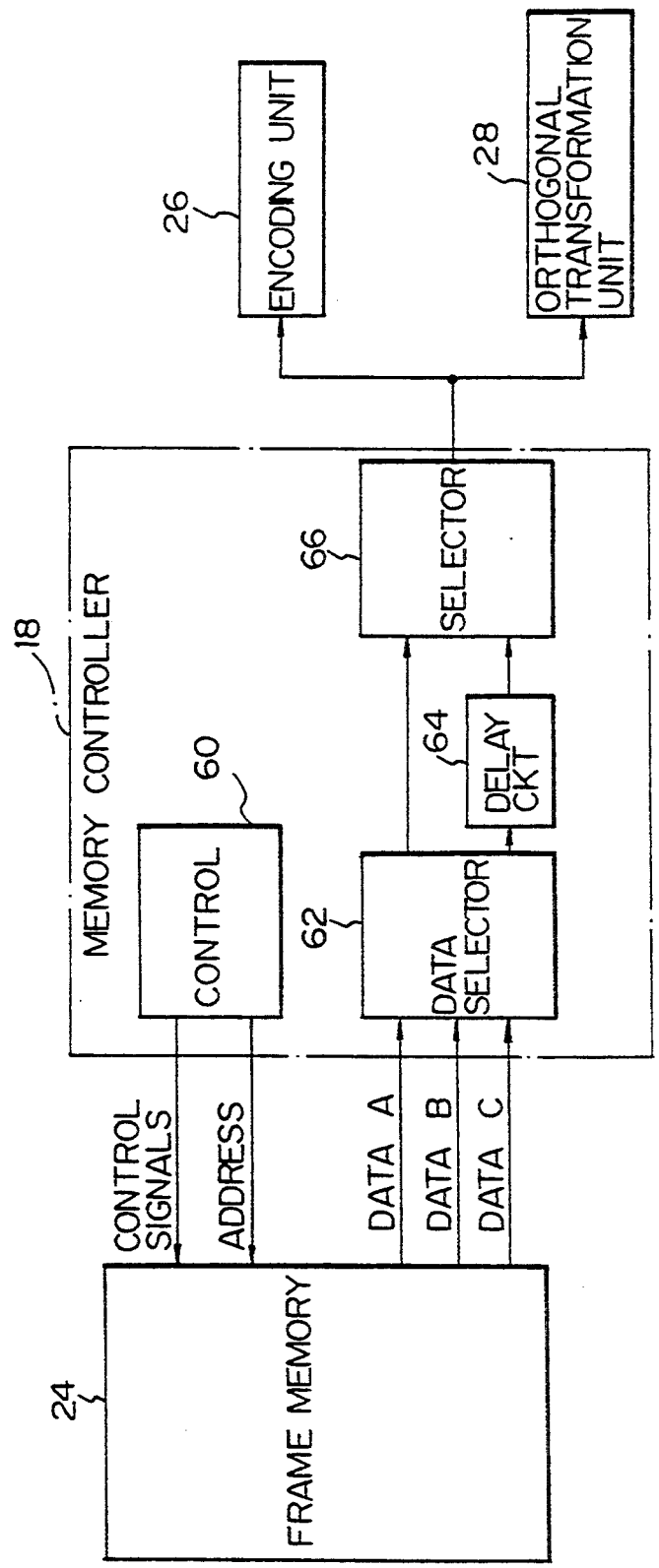

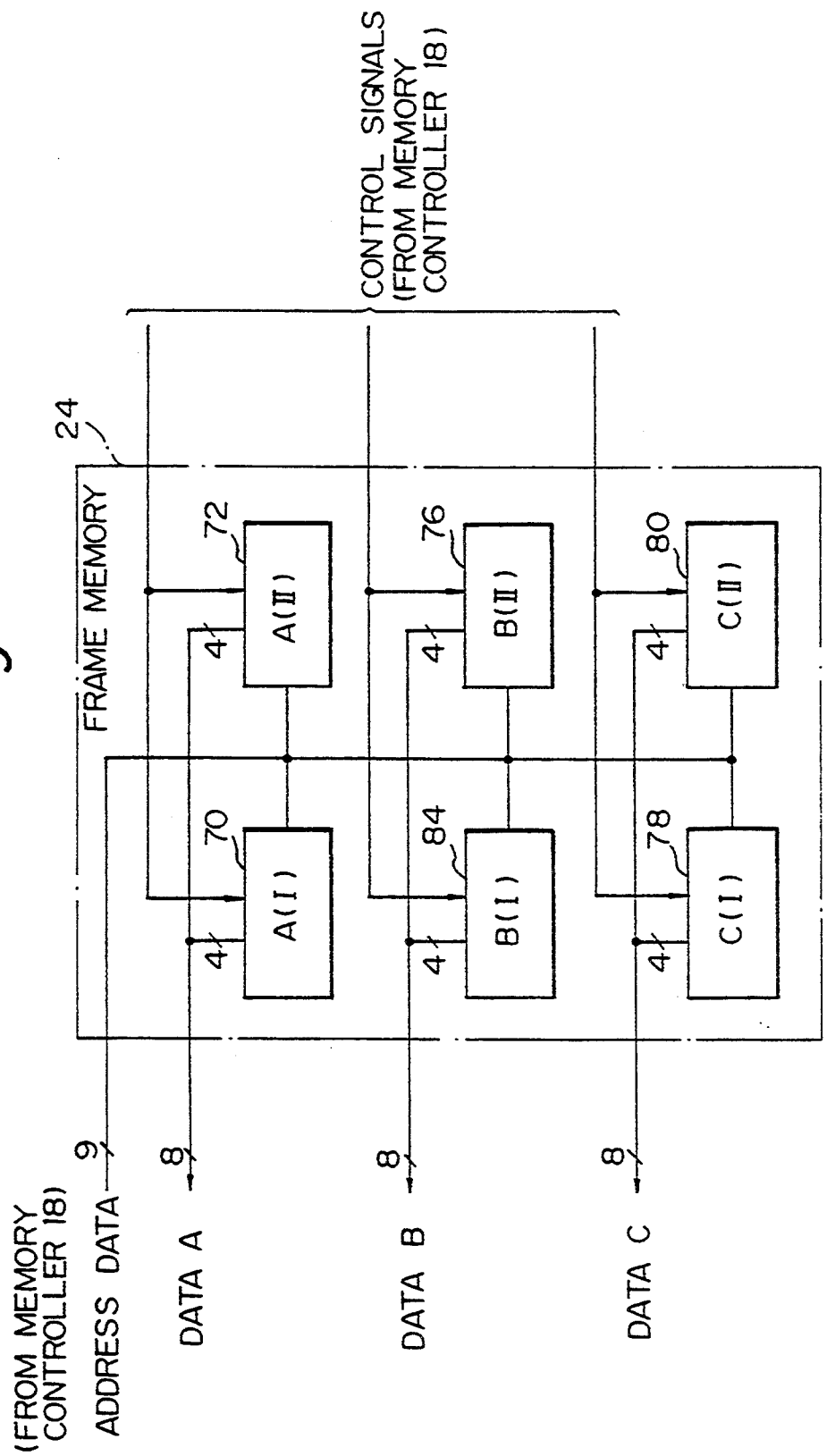

Fig. 5A

MEMORY A

COLUMN ADDRESS →

| ROW ADDRESS | 0 | 1 | 2 | 3 | 4 | 5 | 6 | 7 | --- | 510 | 511 |
|---|---|---|---|---|---|---|---|---|---|---|---|
| 0 | $Y_{00}$ | $Y_{01}$ | $Y_{02}$ | $Y_{03}$ | $Y_{04}$ | $Y_{05}$ | $Y_{06}$ | $Y_{07}$ | --- | $Y_{0510}$ | $Y_{0511}$ |
| 1 | $C_{10}$ | $C_{11}$ | $C_{12}$ | $C_{13}$ | $C_{14}$ | $C_{15}$ | $C_{16}$ | $C_{17}$ | --- | $C_{1510}$ | $C_{1511}$ |
| 2 | $Y_{20}$ | $Y_{21}$ | $Y_{22}$ | $Y_{23}$ | $Y_{24}$ | $Y_{25}$ | $Y_{26}$ | $Y_{27}$ | --- | $Y_{2510}$ | $Y_{2511}$ |
| ⋮ | ⋮ | ⋮ | ⋮ | ⋮ | ⋮ | ⋮ | ⋮ | ⋮ | --- | ⋮ | ⋮ |

Fig. 5B

MEMORY C

COLUMN ADDRESS →

| ROW ADDRESS | 0 | 1 | 2 | 3 | 4 | 5 | 6 | 7 | --- | 510 | 511 |
|---|---|---|---|---|---|---|---|---|---|---|---|
| 0 | $C_{00}$ | $C_{01}$ | $C_{02}$ | $C_{03}$ | $C_{04}$ | $C_{05}$ | $C_{06}$ | $C_{07}$ | --- | $C_{0510}$ | $C_{0511}$ |
| 1 | $Y_{10}$ | $Y_{11}$ | $Y_{12}$ | $Y_{13}$ | $Y_{14}$ | $Y_{15}$ | $Y_{16}$ | $Y_{17}$ | --- | $Y_{1510}$ | $Y_{1511}$ |
| 2 | $C_{20}$ | $C_{21}$ | $C_{22}$ | $C_{23}$ | $C_{24}$ | $C_{25}$ | $C_{26}$ | $C_{27}$ | --- | $C_{2510}$ | $C_{2511}$ |
| ⋮ | ⋮ | ⋮ | ⋮ | ⋮ | ⋮ | ⋮ | ⋮ | ⋮ | --- | ⋮ | ⋮ |

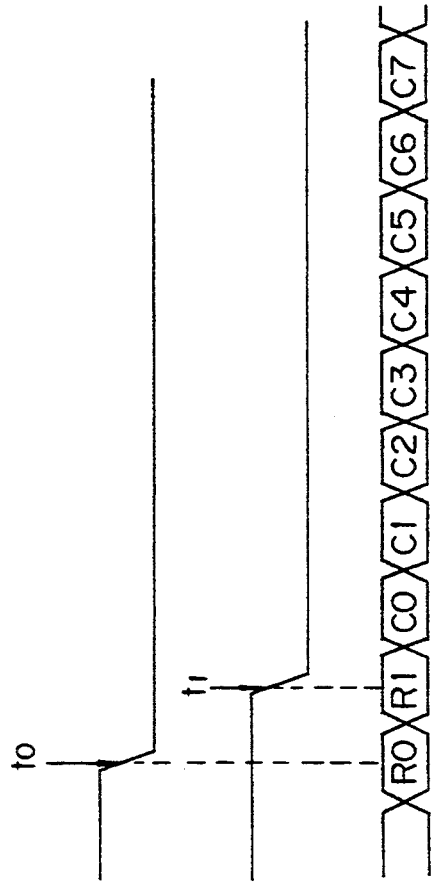

IMAGE DATA STORAGE/PROCESSING APPARATUS

This application is a continuation, of application Ser. No. 07/711,100 filed on Jun. 6, 1991, now abandoned.

BACKGROUND OF THE INVENTION

1. Field of the Invention

The present invention relates to an image data storage/processing apparatus which is particularly applicable to an electronic still camera, for example.

2. Description of the Related Art

For example, a digital electronic still camera is a camera device in which a solid state image pick-up device such as CCD is used to capture a field, and an image signal representative of the thus captured object image is finally stored in a memory in the form of digital data. In general, as the memory, there is used such a memory card type of memory to which a RAM (Random Access Memory), such as a semiconductor memory, is mounted. In this case, in order to efficiently use storage areas of the memory, data compression such as orthogonal transformation encoding is often performed.

Particularly, the orthogonal transformation encoding has been generally employed, since it is possible to perform encoding in a large compression ratio, and also to suppress an image distortion brought by the encoding.

In the digital electronic still camera, if it is important for a memory, such as a frame memory, to temporarily store image data representative of a field to be recorded in consideration of cost, then it would be preferable to use a DRAM (Dynamic RAM). According to such a DRAM, however, when the DRAM is accessed in conjunction with an image data processing, a time exists when it is not permitted to actually output the image data, such as the time required for setting of a row address, pre-charging of electric charge the capacitor of each memory cell which is performed in a predetermined period of time, and so on.

In the digital electronic still camera, on the other hand, as a matter of convenience for image processing, such as a bidimensional orthogonal transformation, etc., which is performed after the image data is read out from the frame memory, it is preferable, in units of block constituting the bidimensional orthogonal transformation to continuously output the image data from the frame memory to the successive image processing circuit.

In an electronic still camera having a reproducing function as well as a recording function, an image signal recorded on a recording medium is read out, expansion-decoded and reproduced on a display device. In such an electronic still camera for use in both the recording and the reproducing, it is necessary to convert an image picked up in the form of a field image signal by an array of photosensitive cells of the image pick-up device, for example, into a frame image signal prior to a compression processing. Consequently, it is necessary to temporarily store the image signal in a memory and read out it in the form of the frame image signal.

Also, it is required for a YC processing circuit to perform such a processing that a luminance signal Y and a color difference signal R-Y, B-Y are produced from the image signal according to the array of photosensitive cells of the image sensor read out in the form of the frame image signal. The luminance signal Y and the color difference signals R-Y, B-Y produced by the YC processing circuit are again stored in the memory and thereafter are compression-encoded. In the compression-encoding, an image field of data is divided into a plurality of blocks to perform the compression-encoding, and thus it is necessary to control readout from the memory so as to permit the readout of every block.

Further, also in a case where the image signal read out from the recording medium is expansion-decoded, it is necessary to temporarily store the image signal in a memory and read out the image signal therefrom, since the plurality of blocks are combined to restore the original image field of the signal. Furthermore, in a case where a reproducing circuit performs such a processing that the decoded image signal is reproduced on the display device, it is necessary to control readout of the decoded image signal.

As mentioned above, it was necessary to perform operations of readout or writing of the image signal from or into the memories on various types of image data and thus a plurality of memories were needed, since controls for the readout and the writing are varied on the respective types of image data.

SUMMARY OF THE INVENTION

It is therefore an object of the present invention to provide an image data storage apparatus capable of continuously reading out the image data from a memory in which an image field of data to be recorded is temporarily stored.

It is another object of the present invention to provide an image signal processing apparatus capable of performing processing for writing in and reading out of various types of image data with a single memory.

In order to achieve the objects of the invention according to an aspect of the present invention, there is provided an image data storage apparatus comprising first storage means for storing image data in a form of units of blocks corresponding to pixels which belong to even-numbered ones of pixel lines constituting a field of an image, second storage means for storing image data in a form of units of blocks corresponding to pixels which belong to odd-numbered ones of the pixel lines constituting the field of the image, image processing means for processing the image data received from said first and second storage means in a form of units of blocks, and control means for controlling a readout timing of the image data stored in the first and second storage means. In the apparatus, the control means provides such a control that the image data corresponding to two adjacent pixel lines on the field are continuously read out in such a manner that they are simultaneously read out from the first and second storage means, and the image data corresponding to one of the two pixel lines are read out with delay by the time required for reading out of the image data corresponding to the other pixel line.

In order to achieve the objects of the invention according to another aspect of the present invention, there is provided an image signal processing apparatus comprising input means for entering an image signal, memory means for storing the image signal, compression-encoding means for compression-encoding the image signal and outputting the thus compression-encoded image signal to a recording medium, expansion-decoding means for expansion-decoding the image signal read out from the recording medium, reproducing means for outputting the image signal to an image display, and memory control means for controlling input and output of the image signal to the memory means. In such apparatus, the memory control means controls readout of the image signal stored in the memory means to the compression-encoding means, writing of the image signal transferred from the expansion-decoding means into the memory means, and readout of the image signal stored in the memory means to the reproducing means.

BRIEF DESCRIPTION OF THE DRAWINGS

The objects and features of the present invention will become more apparent from the consideration of the following detailed description taken in conjunction with the accompanying drawings in which:

FIG. 3 is a schematic block diagram showing a structure of a memory controller in FIG. 1;

FIG. 4 is a schematic block diagram showing a structure of a frame memory in FIG. 1;

FIGS. 5A and 5B are schematic views showing the contents of the image data stored in the memories A and C constituting the frame memory, respectively;

FIGS. 6A through 6F are time charts used for the explanation of the operation for reading out the image data from the frame memory by the memory controller;

DESCRIPTION OF THE PREFERRED EMBODIMENTS

Figure 7:
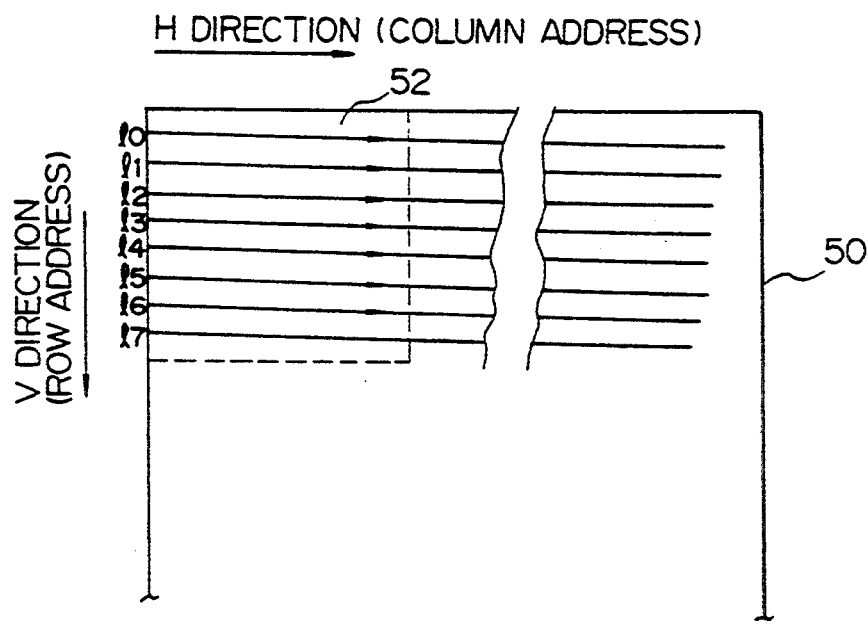
FIG. 7 is a schematic view showing a state in which a field representing a field image to be recorded is divided into a plurality of blocks.
Figure 8A:
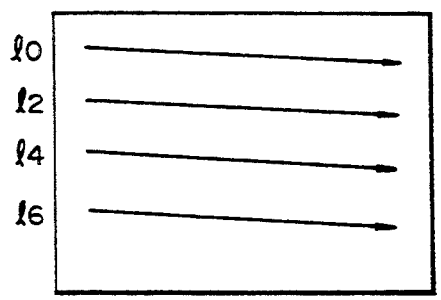
FIGS. 8A and 8B are schematic views each showing a state in which the image data of an area on the field divided into a plurality of blocks are stored in a different memory in units of blocks.

Referring to the accompanying drawings, further details of the embodiments of an image data storage apparatus will be given hereinafter. In a digital electronic still camera to which an image data storage apparatus is applied, as shown in FIG. 7, a field 50 corresponding to an imaging field of an image pick-up device and representing a field image to be recorded is divided into a plurality of blocks 52, and the image data is read out in the form of units of blocks from a frame memory which has previously stored a field of image data or a frame of image data. Each of the blocks 52 consists of a total of 64 pixels, for instance, 8 pixels in a horizontal (H) direction ×8 pixels in a vertical (V) direction. Written into a memory or storage portion A are image data corresponding to the respective pixels which belong to the even-numbered ones ($l_0, l_2, \ldots$) of pixel lines ($l_0, l_1, l_2 \ldots$) constituting the field 50, as shown in FIG. 8A.

Figure 8B:
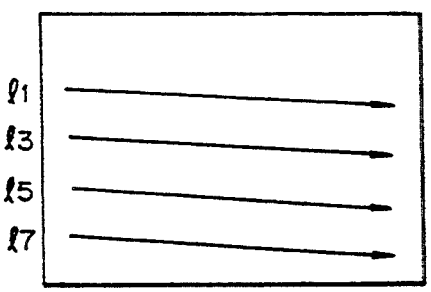

On the other hand, written into a memory B are image data corresponding to the respective pixels which belong to the odd-numbered ones ($l_1, l_3 \ldots$) of the pixel lines ($l_0, l_1, l_2 \ldots$) constituting the field 50, as shown in FIG. 8B. As apparent from the above description, according to the present embodiment, the frame memory is constituted with the memories or storage portions A and B. The image data, which belong to the pixel lines $l_0, l_1$, for example, are continuously read out in such a manner that they are simultaneously read out from the memories A and B, and the image data belonging to the pixel line $l_1$, are read out through a buffer memory with delay by the time required for reading out of the image data belonging to the pixel line $l_0$. In the same manner, it is possible to continuously read out the image data in the form of units of block 52 by means of sequentially reading out the image data of the adjacent two pixel lines on the field from the memories A and B.

Figure 9:
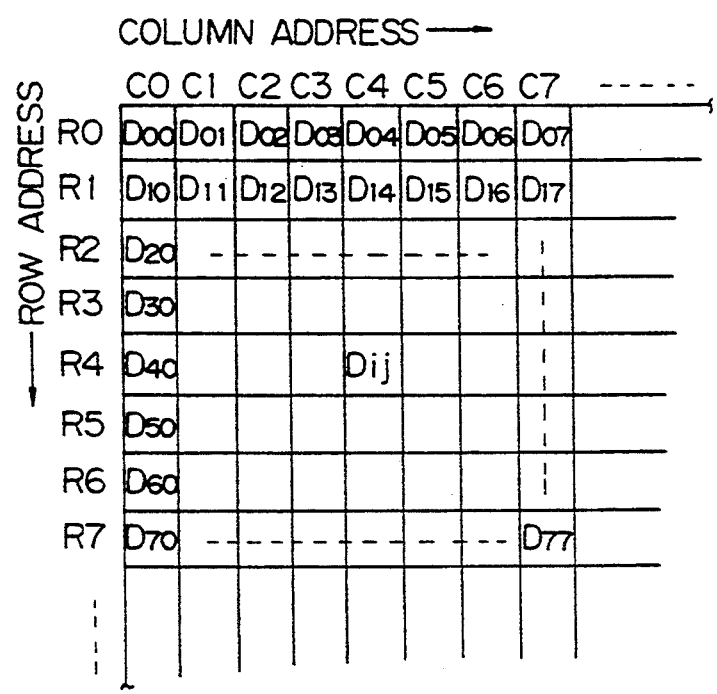
FIG. 9 is also a schematic view showing an example of a state in which the image data have been stored in the frame memory.

Next, referring to FIGS. 9 and 10A–10F, there will be given a specific description on an operation, by way of example in a case, where the image data are read out in units of block 52 from the memories A and B which constitute the frame memory. It is assumed that a memory map of the frame memory coincides with an array of photosensitive cells of an image pick-up device (for example, CCD), as shown in FIG. 9. In this figure, a direction X indicates row addresses, and a direction Y indicates column addresses.

In the memory A, there have been written image data which belong to the row addresses $0, 2, 4, \ldots 2n$, corresponding to even-numbered pixel lines on the field, respectively, and in the memory B, there have been written image data which belong to the row addresses $1, 3, 5, \ldots 2n + 1$, corresponding to odd-numbered pixel lines on the field, respectively.

Figure 10:
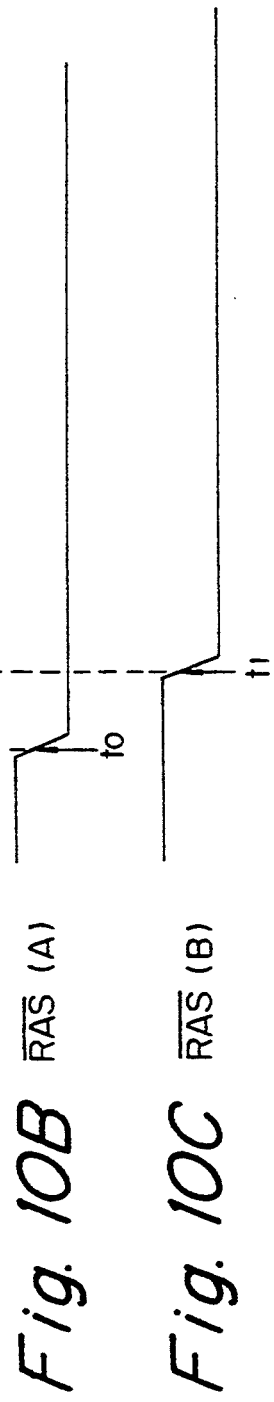
FIGS. 10A through 10F are time charts useful for understanding the operational conditions of the respective parts when reading out the image data from the frame memory.

When control signals $\overline{RAS}$ (ROW ADDRESS STROBE) A and $\overline{RAS}$ B, which trail down at time $t_0$ and $t_1$, respectively, are entered into the memories A and B, respectively, row addresses $R_0$ and $R_1$ are latched in the memories A and B by those control signals, respectively, as shown in FIGS. 10B. 10G and 10A. Next, column addresses $C_0, C_1, \ldots, C_7$ are latched in the memories A and B by control signal $\overline{CAS}$ (COLUMN ADDRESS STROBE), which trails down at time $t_2, t_3, \ldots, t_9$, as shown in FIG. 10D. As a result, simultaneously read out from the memories A and B are image data $D_{00}, D_{01}, D_{02} \ldots, D_{07}$ and image data $D_{10}, D_{11}, D_{12} \ldots, D_{17}$, respectively, as shown in FIGS. 10E and 10F. Further, the image data $D_{10}, D_{11}, D_{12} \ldots, D_{17}$ read out from the memory B among the image data read out from the frame memory are delayed by the time required for reading out of the image data $D_{00}, D_{01}, D_{02} \ldots, D_{07}$ read out from the memory A by a memory controller, not shown, to be continuously output following the image data $D_{00}, D_{01}, D_{02} \ldots, D_{07}$. Accordingly, the image data $D_{00}, D_{01}, D_{02} \ldots, D_{07}, D_{10}, D_{11}, D_{12}, \ldots D_{17}$ of the adjacent two pixel lines on the field, which are simultaneously read out from the memories A and B, are continuously output from the memory controller to a subsequent image processing circuit such as a bidimensional orthogonal transformation unit. Consecutively, output of the image data on the row addresses $R_2$ and $R_7$ are performed on a similar basis as explained above, and thus a block (64 pixels) of image data are continuously output. Thus, the image data are continuously output in units of blocks from the frame memory through the memory controller.

The above-mentioned technical matters are a basic concept of the embodiment of the image data storage apparatus according to the present invention.

Figure 1:
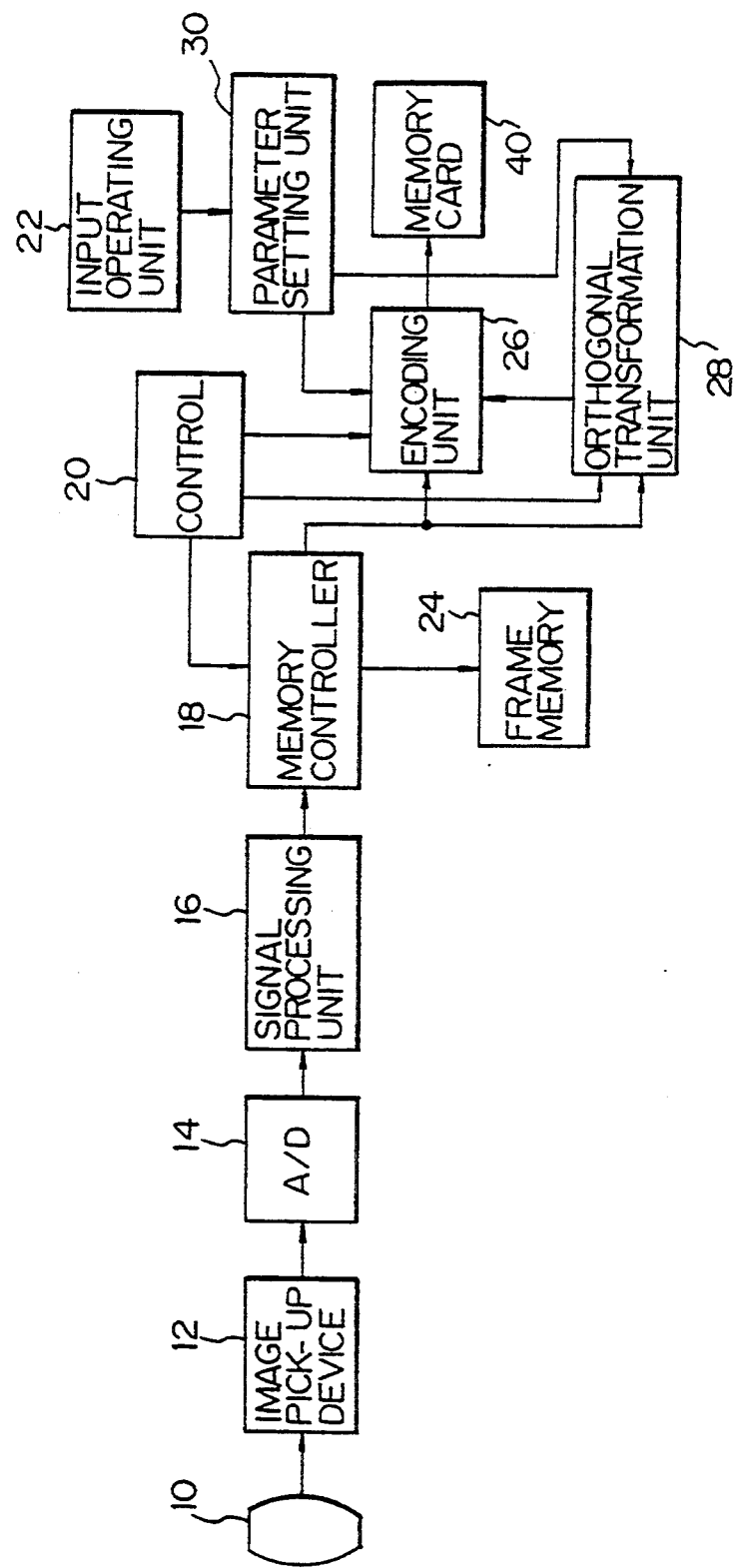
FIG. 1 is a schematic block diagram of an embodiment of a digital electronic still camera to which the image data storage apparatus according to the present invention is applicable.

FIG. 1 is a block diagram of an embodiment of a digital electronic still camera to which the image data storage apparatus according to the present invention is applicable. In the figure, the camera is provided with an image pick-up device 12 adapted to capture a field of image. An image signal representing the captured field image is compression-encoded in the form of digital data by a orthogonal transformation unit 28 and an encoding unit 26, and the thus obtained signal is stored in a memory card 40.

As the image pick-up device 12, a solid state image pick-up device such as a CCD may be preferably used. According to such a device, for example, color image signals representing a field of image captured by an image pick-up lens 10 are output in the form of signal of color components of red (R), green (G) and blue (B). The color component signals are output in a raster scanning scheme similar to TV signals. Regarding other functional sections such as an exposure mechanism and a focusing mechanism, those portions are omitted from the explanation, because they do not directly concern to the understanding of the present invention. The memory card 40 is a memory device in which a semiconductor memory device such as a RAM is supported on a card-like configuration of a base, and is mounted on a main body on a detachable basis.

An output of the image pick-up device 12 is connected to an analog-to-digital converter (AD) 14 which is a signal converter circuit for converting an input analog image signal into the corresponding digital data. This digital data is quantized with, for example, 8 bits, on each of the color component signals RGB. An output of the digital data is coupled to a signal processing unit 16.

Figure 2:
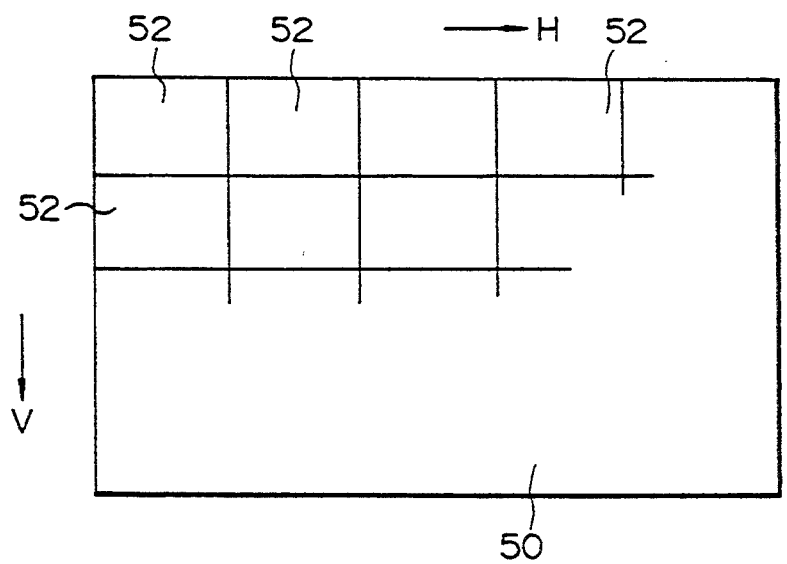
FIG. 2 is a schematic view showing an example of a block structure of a field in the embodiment shown in FIG. 1.

The signal processing unit 16 performs, according to the present embodiment, a signal processing so that a pre-processing, such as a white balance adjustment, and a tone correction are provided for the image data, and a processing for providing brightness-color difference in which color component signal data is converted into a luminance signal (Y) and two phases-of color difference signals (R-Y, B-Y). An output of the signal processing unit 16 is connected to a memory controller 18 which is connected to a frame memory 24. The memory controller 18 controls storage of the output from the signal processing unit 16 into the frame memory 24 and readout from the frame memory 24. The image signals output from the image pick-up device 12 takes a form of ordinary raster scanning of a sequence signal. The memory controller 18 provides a block formation of the image data. That is, as shown in FIG. 2, a frame of field 50 is divided into a plurality of blocks 52 each having a predetermined bulk of an area, and the image data are read out on each block 52.

Each block 52 may be given with a capacity, for instance, 8 pixels in a horizontal scanning direction (H) and 8 pixels in a vertical scanning direction (V), and also may be given with a capacity having mutually different numbers of pixels in the horizontal scanning direction (H) and the vertical scanning direction (V). Thus, the image data read out in units of block 52 are transmitted to the encoding unit 26 and the orthogonal transformation unit 28.

The image data, which have been read out in units of blocks from the frame memory 24 under the control of the memory controller 18, are transmitted to the encoding unit 26 so that activity is calculated. Thereafter, the image data are transmitted every block to the orthogonal transformation unit 28 for orthogonal transformation, and then transmitted to the encoding unit 26 for encoding.

The orthogonal transformation unit 28 has such a function that orthogonal transformation for the image data entered from the memory controller 18 is performed in units of blocks and then are output. As the orthogonal transformation, for example, bidimensional discrete cosine transformation (DCT) may be preferably applied. Consequently, the image data on each block 52 are transformed into data of a frequency domain so that the data are arranged in the order of a lower frequency in the horizontal scanning direction (H) and the vertical scanning direction The image data on each block, which have been subjected to the bidimensional orthogonal transformation processing in the orthogonal transformation unit 28, are arranged in a matrix configuration in such a manner that a lower order of data is located at an upper left portion and in proportion, toward a lower right direction, a higher order of data is disposed. A DC component of data is disposed at an upper left portion. The output of the orthogonal transformation unit 28 is transmitted to the encoding unit 26.

The encoding unit 26 is operative to perform a coefficient round-down processing for the image data subjected to the bidimensional orthogonal transformation processing in the orthogonal transformation unit 28, that is, a transformation coefficient, and then to perform normalization. The coefficient round-down processing is performed in such a manner that the transformation coefficient subjected to the orthogonal transformation is compared with a predetermined threshold value, and the part less than the threshold value is rounded down. The normalization is performed it, such a manner that the transformation coefficient subjected to the coefficient round-down processing is divided by a predetermined quantizing step value, that is, a normalization coefficient $\alpha$, so that quantization by the normalization coefficient $\alpha$ is performed.

The normalization coefficient $\alpha$ is set in accordance with a total activity of the image data or the sum total of activities, by using the equation as set forth below:

$$\alpha = K1 \cdot (\text{a total activity}) + K2$$

wherein K1 and K2 are parameters for providing fixed-length normalization.

The encoding unit 26 encodes the DC component of the data on each block entered from the memory controller 18 and the AC component of the data on each block entered from the orthogonal transformation unit 28. An amount of the encoded data output from the encoding unit 26 is limited in accordance with the activity of each individual block. That is, output of the encoded data on each block is limited, for providing fixed-length normalization, in accordance with the ratio of a total activity or the sum total activities of the respective blocks to the activity of each individual block.

The orthogonal transformation unit 28 and the encoding unit 26 perform various compression-encodings in accordance with various parameters entered from a control unit 20, and each are formed, for example, by a single IC chip.

The output of the encoding unit 26 are transmitted through a connector, not illustrated, to the memory card 40. The memory card 40 may be a memory device in which a semiconductor memory device such as a SRAM, or a EEPROM is supported on a card configuration of a base, and is mounted on a main body on a detachable basis. A parameter setting unit 30 is adapted to set parameters necessary for compression-encoding on the respective luminance signal (Y), and color difference signals $C_r$ (R-Y) and $C_b$ (B-Y) in the case of color image data, and outputs them to the encoding unit 26.

Connected to the parameter setting unit 30 is an input operating unit 22 from which an instruction for setting various parameters for use in the compression-encoding is entered. The parameter setting unit 30 selects a desired one from among the parameters stored in a memory unit, not shown, in accordance with the instruction from the input operating unit 22.

The control unit 20 is for controlling the main body in its entirety, and in particular for outputting a outputs a standby signal or an active signal to the orthogonal transformation unit 28 and the encoding unit 26. Furthermore, the control unit 20 outputs a control signal for controlling readout of the image data from the frame memory 24 to the memory controller 18.

Next, the structures of the memory controller 18 and the frame memory 24 are shown in FIGS. 3 and 4, respectively. In FIG. 3, the memory controller 18 includes a controls device 60, a data selector 62, a delay circuit 64 and a selector 66. The control device 60 supplies to the frame memory 24 address data and various control signals such as $\overline{RAS}$, $\overline{CAS}$, $\overline{WE}$ (WRITE ENABLE) and $\overline{OE}$ (OUTPUT ENABLE).

The data selector 62 selectively outputs image data from amount plural kinds of data, for example, three kinds of image data A, B and C are read out from the frame memory 24. The data selector 62 outputs one of the two kinds of image data directly to the selector 66 and the other kind of image data through the delay circuit 64 to the selector 66, respectively. Where the image data A, B and C represent, as will be explained later, image data of the luminance signal (Y) and the color difference signals $C_r$(R-Y) and $C_b$(B-Y) read out from three memories A, B and C constituting the frame memory 24 in which a frame of image data are stored.

Two kinds of image data, which are output from the data selector 62, relate to the same kind of image signals of the pixel arrays adjacent to each other from among a group of pixels constituting a frame of the field.

The delay circuit 64 delays an output of the image data by the time required for reading out of 8 pixels of image data.

The selector 66 outputs the image data output directly from the data selector 62 or the image data output through the delay circuit 64, upon alternatively switching by 8 pixels in correspondence, to the encoding unit 26 and the orthogonal transformation unit 28.

The frame memory 24 includes, as shown in FIG. 4, a memory A including a memory A (I) 70 and a memory A (II) 72, a memory B including a memory B (I) 74 and a memory B (II) 76 and a memory C including a memory C (I) 78 and a memory C (II) 80. In a case where a field is captured by using, for example, a CCD having 488 ×768 photosensitive cells in length and breadth of an imaging surface, as the image pick-up device 12, there are needed six DRAMs each having 1 M bits in storage capacity for storing a field of image data of a color image, because an amount of data is given by $Y:C_r:C_b=4:2:2$ in the luminance signal (Y) and the color difference signals $C_r$ and $C_b$. Therefore, according to the present embodiment, the frame memory 24 includes six DRAMs (each having 1 M bits in storage capacity) such as the memories A (I) 70, A (II) 72, B (I) 74, B (II) 76, C (I) 78 and C (II) 80.

Next, the contents of the image data stored in the memories A and C are shown in FIGS. 5A and 5B, respectively. In those figures, data $Y_{ij}$ and $C_{ij}$ represent image data of the luminance signal and the color difference signals at row (i), column (j) constituting a frame, respectively. Among the image data $C_{ij}$, ones which are given with the even number of j represent the color difference signal $C_r$, and ones which are given with the odd number of j represent the color difference signal $C_b$.

Now, referring to FIGS. 6A–6F, described hereinafter is an operation for reading out the image data from the frame memory 24 by the memory controller 18 in FIG. 3, by way of example, in a case where the image data stored in the memories A and B are output by the data selector 62.

When the control signals $\overline{RAS}$ A and $\overline{RAS}$ C, which trail down at time $t_0$ and $t_1$ in FIGS. 6A and 6B, respectively, are entered into the frame memory 24, row addresses $R_0$ and $R_1$ entered from the control device 60 are latched in the memories A and C by those control signals $\overline{RAS}$ A and $\overline{RAS}$ C, respectively, as shown in FIGS. 6A, 6B and 6C. Next, column addresses $C_0$, $C_1$, ..., $C_7$ entered from the control device 60 are latched in the memories A and C by control signal $\overline{CAS}$, which trail down at time $t_2$, $t_3$..., $t_9$, as shown in FIGS. 6D and 6C. As a result, simultaneously read out from the memories A and C are image data $Y_{00}$, $Y_{01}$, $Y_{02}$..., $Y_{07}$ of the luminance signal in the pixel array of row "0" on the frame and image data $Y_{10}$, $Y_{11}$, $Y_{12}$, ..., $Y_{17}$ of the luminance signal in the pixel array of row "1" on the frame, respectively, as shown in FIGS. 6E and 6F.

While the image data $Y_{00}$, $Y_{01}$, $Y_{02}$..., $Y_7$ of the luminance signal read out from the memory A among the image data read out from the frame memory are output directly from the data selector 62 to the control device 60, the image data $Y_{10}$, $Y_{11}$, $Y_{12}$, ..., $Y_{17}$ of the brightness signal read out from the memory C are delayed with the delay circuit 64 by the time required for reading out of 8 pixels of image data and then are output to the selector 66. Thus, the image data, which are simultaneously read out from the memories A and B, are continuously output from the selector 66 to the encoding unit 26 and the orthogonal transformation unit 28, as $Y_{00}$, $Y_{01}$, $Y_{02}$, ..., $Y_{07}$, $Y_{10}$, $Y_{11}$, $Y_{12}$, ..., $Y_{17}$. Also regarding row addresses 2–7, in the similar way, the image data of the luminance signal are simultaneously read out from the memories A and C, so that readout of a block of image data is performed. Continuous performance of such an operation permits the image data to be read out in units of blocks.

Next in a case where the image data of the color difference signal are read out, the control signals $\overline{RAS}$ C and $\overline{RAS}$ A, which trail down at time $t_0$ and $t_1$, respectively, are output from the control device 60 to the frame memories C and A, which are not illustrated. Furthermore, column addresses $C_0$, $C_1$, ..., $C_7$ are latched in the memories C and A by the control signal $\overline{CAS}$, as shown in FIG. 6D. As a result, simultaneously read out from the memories C and A are image data $C_{00}, C_{01}, C_{02}, \ldots, C_7$ and image data $C_{10}, C_{11}, C_{12}, \ldots, C_{17}$, respectively. Thus, the image data are continuously output from the selector 66, as $C_{00}, C_{01}, C_{02}, \ldots, C_{07}, C_{10}, C_{11}, C_{12}, \ldots, C_{17}$. Finally, similar to the case of the image data of the brightness or the intensity signal, the image data of the color difference signals are output to the encoding unit 26 and the orthogonal transformation unit 28 in units of blocks.

According to the present embodiment, as a matter of convenience in explanation, while there is stated only a case where the image data are read out from the memories A and C among the frame memory 24, it is applicable also to other cases.

Figure 11:
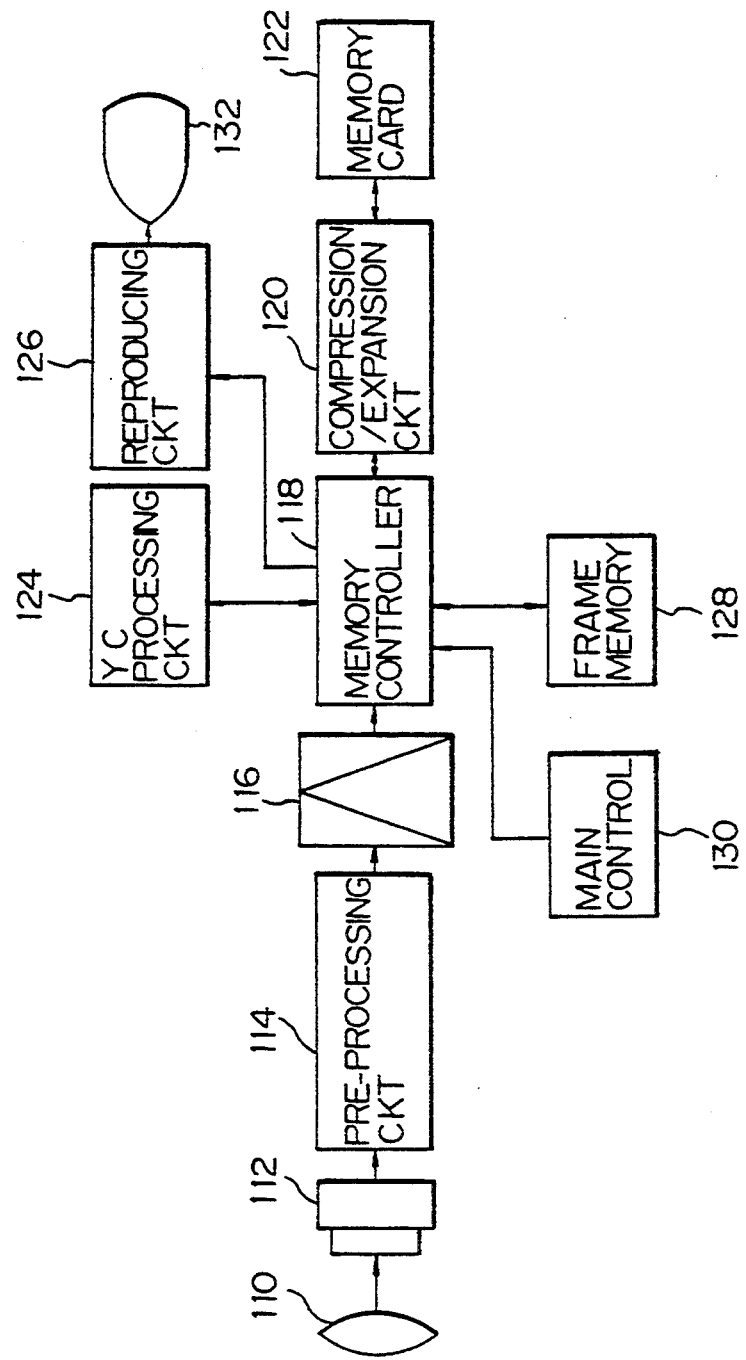
FIG. 11 is a schematic block diagram of an alternative embodiment of a digital electronic still camera having a reproducing function as well as a recording function to which the image data storage apparatus according to the present invention is applicable.

Next, details of the embodiments of an image signal processing apparatus according to another aspect of the present invention will be given hereinafter. FIG. 11 shows a block diagram of another embodiment of a digital electronic still camera having a reproducing function as well as a recording function to which the image data storage apparatus according to the, present invention is applicable. In the apparatus according to the present invention, as shown in FIG. 11, image signals, which are obtained by picking-up an object image entered through an optical lens 110, are subjected to data compression processing and then stored in a memory card 122, and reproduced on an image monitor 132 as visible images. Further in the apparatus, the image signals stored in the memory card 122 are read out therefrom to be expansion-decoded, and the thus obtained signals are reproduced on an image monitor 132.

The memory card 122 is a semiconductor memory device for storing the image signals which is capable of storing and holding the image signals in the same condition. However, according to the present invention, it is not restricted to such a memory device, and other file memory devices such as a magnetic disk and an optical disk instead of the memory card 122 may also be effectively applied.

An image pick-up device 112 is adapted to pick up the object image entered through the optical lens 110 and to output image signals. The image pick-up device 112 is, for example, a single disc type of a solid-state image pick-up device having a RGB segment array of color filters. An output of the image pick-up device 112 is connected to a pre-processing circuit 114 for performing pre-processing such as a white balance adjustment and a tone correction. An output of the pre-processing circuit 114 is connected to a AD converter circuit 116 for converting an input analog image signal to a corresponding digital signal.

An output of the AD converter circuit 116 is connected to a memory controller 118 for controlling write-in into a frame memory 128 and readout from the frame memory 128. As will be described later in detail, under the control of the memory controller 118, there is provided a control such that an image signal of a field signal transmitted from the AD converter circuit 116 is written into the frame memory 128, then read out from the frame memory 128 as a frame signal to perform a YC processing, which will be described later, by a YC processing circuit 124, and thereafter again written into the frame memory 128. Furthermore, a field is divided into a plurality of blocks, and the image signal read out is transmitted in units of blocks to a compression/expansion circuit 120. In the compression/expansion circuit 120, the image signals are compression-encoded and are then output to the memory card 122. The image signals, which are read out from the memory card 122 and expansion-decoded by the compression/expansion circuit 120, are temporarily stored in the frame memory 128. The image signals read out from the frame memory 128 are transmitted to a reproducing circuit 126, and reproduced on the image monitor 132 as visible images.

The YC processing circuit 124 performs a processing such that a luminance signal Y and color difference signals R-Y and B-Y are produced from the image signal according to the array of photosensitive cells of the pick-up device 112 read out from the frame memory 128. The luminance signal Y and the color difference or chrominance signals R-Y and B-Y produced by the YC processing circuit 124 are again stored in the frame memory 128, and thereafter an image field of data is divided into a plurality of blocks and output to the compression/expansion circuit 120. The compression/expansion circuit 120 performs the compression-encoding for the luminance signal Y and the color difference signals R-Y and B-Y transmitted in units of block, respectively. The compression-encoding is performed, for example, by means of bidimensional orthogonal transformation, normalization and Huffman encoding of the image signal on each block. The image signals compression-encoded by the compression/expansion circuit 120 are recorded on the memory card 122 making a distinction between the luminance signal Y and the color difference signals R-Y and B-Y.

A reproducing circuit 126 converts the luminance signal Y and the color difference signals R-Y and B-Y in their timing to, for example, RGB signals. The image signals converted by the reproducing circuit 126 are reproduced on an image monitor 132 as visible images. The reproducing circuit 126 may be one which outputs the image signals in a form of the luminance and color difference signals by the NTSC format. The reproducing circuit 126 is constructed so that the image is output in a form of a soft copy to the image monitor 132.

A main control 130 is a control unit for controlling the function units of the apparatus according to the present embodiment, and may be adapted to output various kinds of instruction to the memory controller 118 in accordance with an instruction input from a console, which is not shown.

Figure 12:
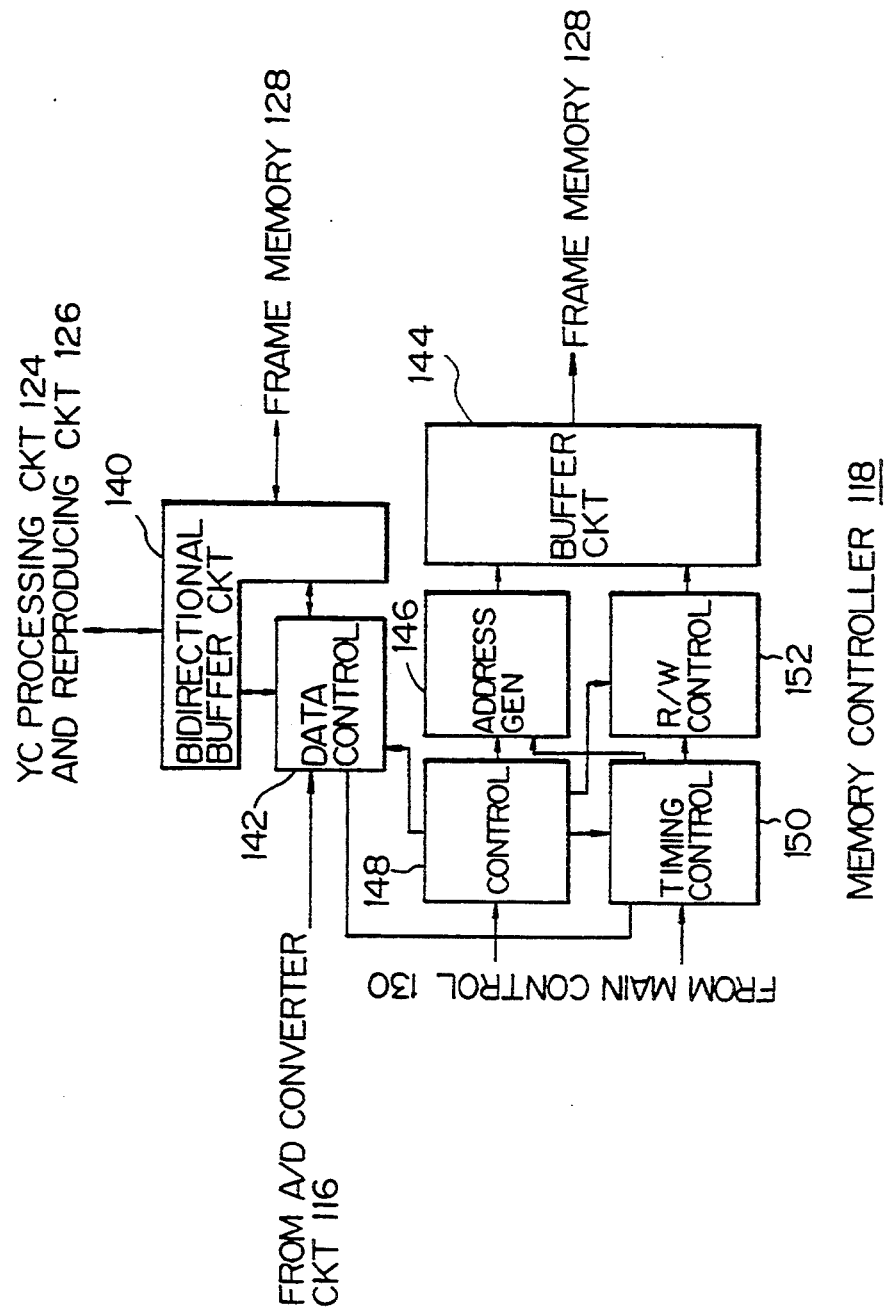
FIG. 12 is a schematic block diagram showing a structure of a memory controller in FIG. 11.

FIG. 12 shows a structure of the memory controller 118 provided with a data control circuit 142 and a bilateral buffer circuit 140. In the memory controller 118, the image data entered from the AD converter circuit 116 is transmitted through the data control circuit 142 and the bidirectional buffer circuit 140 to the frame memory 128. The image data read out from the frame memory 128 is transmitted through the bidirectional buffer circuit 140 and the data control circuit 142 to the YC processing circuit 124 and the reproducing circuit 126. The memory controller 118 is provided with a control unit 148 for controlling on the basis of the control signal transmitted from the main control 130 the respective functional units of the memory controller 118, that is, a timing control circuit 150, an address generating circuit 146, a read/write control circuit 152 and a data control circuit 142.

The timing control circuit 150 produces timing signals necessary for the respective functional units of the memory controller 118, by means of dividing a signal of 28 MHz for example. The address generating circuit 146 generates addresses for writing the various image data into the frame memory 128 in accordance with the image data. The address generating circuit 146 generates an address for writing into the frame memory 128 image data of a field signal according to a pixel array of the pick-up element, which is entered from the AD converter circuit 116, an address for reading out the thus written-in image data as a frame signal to transmit the same image data to the YC processing circuit 124, an address for writing into the frame memory 128 the luminance signal Y and the color difference signals R-Y and B-Y transmitted from the YC processing circuit 124, an address for reading out data of the luminance signal Y and the color difference signals R-Y and B-Y in units of blocks to transmit the thus written-in image data to the compression/expansion circuit 120, an address for writing into the frame memory 128 data expansion-decoded of the luminance signal Y and the color difference signals R-Y and B-Y in units of blocks transmitted from the compression/expansion circuit 120, and an address for reading out the thus written-in image data to the reproducing circuit 126.

The read/write control circuit 152 generates control signals for reading and writing on the basis of the timing signal which is transmitted from the timing control circuit 150 in accordance with the control signal transmitted from the control unit 148. The buffer circuit 144 temporarily stores and outputs to the frame memory 128 the address signals transmitted from the address generating circuit 146 and the control signals for control of reading and writing transmitted from the read/write control circuit 152.

According to the apparatus of the present embodiment, at the time of capture recording, an image of an object is entered from the optical lens 110 and is picked up by the pick-up device 112. The image signals output from the pick-up device 112 are subjected to the pre-processing such as a white balance adjustment and a tone correction in the pre-processing circuit 114, are then converted into the digital signals in the AD converter circuit 116, and are output to the memory controller 118. The image data of the field signals according to the array of photosensitive cells of the pick-up device, which have been transmitted to the memory controller 118, are controlled to be stored in the frame memory 128. The image data stored in the frame memory 128 are read out, under the control of the memory controller 118, as the frame signals are then transmitted to the YC processing circuit 124.

In the YC processing circuit 124, the image data of the luminance signal Y and the color difference signals R-Y and B-Y are produced from the image signal according to the array of photosensitive cells of the pick-up device 112. The image data of the luminance signal Y and the color difference signals R-Y and B-Y produced by the YC processing circuit 124 are stored in the frame memory 128 by control of the memory controller 118. Regarding the image data stored in the frame memory 128, under the control of the memory controller 118, an image field of data is divided into a plurality of blocks and output to the compression/expansion circuit 120 in units of blocks. The compression/expansion circuit 120 performs the compression-encoding for the image data of the luminance signal Y and the color difference signals R-Y and B-Y transmitted in units of blocks, respectively. The image data compression-encoded by the compression/expansion circuit 120 are recorded on the memory card 122 making a distinction between the data of the luminance signal Y and the color difference signals R-Y and B-Y.

On the other hand, at the time of readout reproduction, the image data recorded on the memory card 122 are read out and transmitted to the compression/expansion circuit 120 to be expansion-decoded. The image data expansion-decoded on each block are stored in the frame memory 128 by control of the memory controller 118. The image data stored in the frame memory 128 are read out and transferred to the reproducing circuit 126. The reproducing circuit 126 converts the image data to RGB signals, for example. The image data converted by the reproducing circuit 126 are reproduced on the image monitor 132 as visible images.

Writing-in and reading out from the frame memory 128 in the operation as mentioned-above are controlled by the memory controller 118 as follows. A control signal is transmitted from the main control 130 to the control unit 148 of the memory controller 118 in accordance with an instruction input from a console, not shown, by an operator. Thus, the control unit 148 outputs control signals to the timing control circuit 150, the address generating circuit 146, the read/write control circuit 152 and the data control circuit 142. The image data transmitted from the AD converter circuit 116 to the data control circuit 142, or the image data transmitted from the frame memory 128 to the bidirectional buffer circuit 140 are controlled in a flow in accordance with the control signals from the control unit 148 so as to be transferred through the bidirectional buffer circuit 140 to the YC processing circuit 124, the reproducing circuit 126 and the frame memory 128.

In a case where the image data are transferred to the frame memory 128, an address is generated from the address generating circuit 146 in response to the control signal from the control unit 148, and is transferred through a buffer circuit 144 to the frame memory 148. Furthermore, control signals for reading or writing are generated from the read/write control circuit 152 on the basis of the timing signal output from the timing control circuit 150 by the control unit 148, and are transferred through the buffer circuit 144 to the frame memory 128.

According to the apparatus of the present embodiment, writing of the respective image data into the frame memory 128 and reading of the respective image data from the frame memory 128 are controlled by the memory controller 118 as explained above. Consequently, even in a case where the image data are written into the frame memory or read out from the frame memory in various forms, there is no necessity for preparation of individual memories making a distinction between different controls for addressing of read or write operations and so on. Accordingly, it is possible to reduce the number of memories to be used. This advantage makes it possible to provide a more compact apparatus, for thereby preventing an increase in the number of circuits in the apparatus which even includes the reproducing function.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An image data storage apparatus applicable to an image processing apparatus adopting a compression scheme according to an orthogonal transformation, said image data storage apparatus comprising:

first storage means for storing first image data in a form of units of blocks corresponding to first pixels, covering a first group of even-numbered pixel lines constituting an image;

second storage means for storing second image data in a form of units of blocks corresponding to second pixels covering a second group of odd-numbered pixel lines each interlacing said first group of even-numbered pixel lines;

control means for controlling a readout timing of said first and second image data respectively stored in said first and second storage means so that said first and second image data are simultaneously read out and continuously aligned;

image processing means for processing said first and second image data received from said first and second storage means in a form of units of blocks;

wherein said control means provides such a control that said first and second image data are simultaneously read out from said first and second storage means, and either of the first and second image data is read out with delay by the time required for reading out each one of them so that said first and second image data are continuously aligned.

2. An image data storage apparatus according to claim 1, wherein said control means includes delay means for providing delay by the time required for reading out the first or second image data.

3. An image data storage apparatus according to claim 1, wherein said apparatus is applicable to an electronic still camera including a frame memory for temporarily storing image data in a form of units of blocks representative of a field to be recorded, and wherein at least said first and second storage means constitute said frame memory.

4. An image data storage apparatus according to claim 3, wherein said electronic still camera further includes a memory controller for controlling said frame memory, and at least said control means constitutes said memory controller.

5. An image data storage apparatus according to claim 3, wherein said frame memory comprises a dynamic RAM.

6. An image data storage apparatus according to claim 4, wherein said memory controller includes delay means for providing delay by the time required for reading out the first or second image data in a form of units of blocks.

7. A method for processing image signals, comprising the steps of:

(a) receiving an image signal representative of an object image captured by an image pick-up device and storing said image signal in a frame memory;

(b) reading the image signal out the frame memory, converting the image signal thus read out to a luminance signal and a color difference signal, and storing the luminance and color difference signals in the frame memory; and (c) outputting the said luminance signal and the color difference signal stored in the frame memory to perform a compression-encoding thereon so as to record the luminance and color difference signals compression-encoded on a recording medium.

8. A method for processing image signals in accordance with claim 7, further comprising the steps of;

(d) expansion-decoding the luminance signal and the color difference signal compression-encoded at said step (c), and storing the luminance and color difference signals expansion-decoded in the frame memory; and (e) transferring the luminance signal and the color difference signal stored in the frame memory to a reproducing circuit to be reproduced as the object image.

9. A method for processing image signals in accordance with claim 7, wherein the image signal comprises an analog signal, and further comprising the step of:

pre-processing at a preprocessing circuit and converting the analog signal into a digital signal by an A/D converter under the control of a memory controller.

10. An image signal processing apparatus comprising:

input means for entering an image signal;

memory means for storing the image signal;

image signal processing means for converting the image signal to a luminance signal and a color difference signal;

compression-encoding means for compression-encoding the image signal and outputting a compression-encoded image signal to a recording medium; and memory control means for controlling the input and the output of the image signal to said memory means, wherein said memory control means sequentially controls reading out the image signal stored in said memory means to said image signal processing means, obtaining the luminance signal and the color difference signal from said image signal processing means, storing the luminance signal and the color difference signal in said memory means, and reading out the luminance signal and the color difference signal stored in said memory means so that the luminance signal and the color difference signal are transferred to said compression-encoding means.

11. An image signal processing apparatus in accordance with claim 10, further comprising:

expansion-decoding means for expansion-decoding the image signal read out from said recording medium; and reproducing means for outputting the image signal to an image display, wherein said memory control means sequentially controls writing of the luminance signal and the color difference signal expansion-decoded and transferred from said expansion-decoding means into the memory means, and reading out said luminance signal and said color difference signal stored in said memory means to said reproducing means.

* * * * *